(12) United States Patent
Chun et al.

(10) Patent No.: US 12,230,321 B2
(45) Date of Patent: Feb. 18, 2025

(54) DEVICE WITH NEURAL NETWORK

(71) Applicant: SAMSUNG ELECTRONICS CO., LTD., Suwon-si (KR)

(72) Inventors: Jung-Hoon Chun, Suwon-si (KR); Jiho Song, Suwon-si (KR); Yoonmyung Lee, Suwon-si (KR); Jua Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 153 days.

(21) Appl. No.: 17/830,004

(22) Filed: Jun. 1, 2022

(65) Prior Publication Data

US 2023/0186986 A1 Jun. 15, 2023

(30) Foreign Application Priority Data

Dec. 15, 2021 (KR) .................. 10-2021-0179808

(51) Int. Cl.
*G11C 13/00* (2006.01)
*G11C 11/16* (2006.01)
*G11C 11/54* (2006.01)

(52) U.S. Cl.
CPC ........ *G11C 13/004* (2013.01); *G11C 11/1673* (2013.01); *G11C 11/54* (2013.01);
(Continued)

(58) Field of Classification Search
CPC ... G11C 13/004; G11C 11/1673; G11C 11/54; G11C 13/0038; G11C 13/0069;
(Continued)

(56) References Cited

U.S. PATENT DOCUMENTS 8,493,776 B1 7/2013 Yu et al.
9,111,622 B2 8/2015 Subramanian et al.
(Continued)

FOREIGN PATENT DOCUMENTS

JP 5190719 B2 4/2013
KR 2003-0083557 10/2003
(Continued)

OTHER PUBLICATIONS

Extended European search report issued on Jun. 12, 2023, in counterpart European Patent Application No. 22211145.2 (13 pages in English).

(Continued)

*Primary Examiner* — Donald H B Braswell
(74) *Attorney, Agent, or Firm* — NSIP Law

(57) ABSTRACT

A device with a neural network includes: a synaptic memory cell comprising a resistive memory element, which is disposed along an output line and which has either one of a first resistance value and a second resistance value, and configured to generate a column signal based on the resistive memory element and an input signal in response to the input signal being received through an input line; a reference memory cell comprising a reference memory element, which is disposed along a reference line and which has the second resistance value different from the first resistance value, and configured to generate a reference signal based on the reference memory element and the input signal; and an output circuit configured to generate an output signal for the output line from the column signal and the reference signal.

19 Claims, 10 Drawing Sheets

(52) U.S. Cl.
CPC ...... *G11C 13/0038* (2013.01); *G11C 13/0069* (2013.01); *G11C 2013/0045* (2013.01); *G11C 2013/0054* (2013.01); *G11C 2211/5634* (2013.01)

(58) Field of Classification Search
CPC ........ G11C 2013/0045; G11C 11/1693; G06N 3/048; G06N 3/065; G06N 3/049; G06N 3/063; G06N 3/08
See application file for complete search history.

(56) References Cited

U.S. PATENT DOCUMENTS

| | | | |
|---|---|---|---|
| 10,528,643 | B1 | 1/2020 | Choi et al. |
| 2008/0002481 | A1 | 1/2008 | Gogl et al. |
| 2016/0099040 | A1 | 4/2016 | Andre et al. |
| 2016/0155486 | A1* | 6/2016 | Iizuka ..................... G11C 7/18 365/66 |
| 2018/0301187 | A1* | 10/2018 | Ignowski ........... G11C 13/0002 |
| 2019/0348096 | A1* | 11/2019 | Antonyan .......... G11C 13/0026 |
| 2019/0385656 | A1* | 12/2019 | Lee ...................... G11C 11/161 |
| 2020/0034686 | A1 | 1/2020 | Chiu et al. |
| 2020/0135253 | A1* | 4/2020 | Gupta ................. G11C 11/1673 |
| 2021/0334633 | A1 | 10/2021 | Hwang |

FOREIGN PATENT DOCUMENTS

| | | |
|---|---|---|
| KR | 10-2016-0101901 | 8/2016 |
| KR | 10-2018-0112458 | 10/2018 |
| KR | 10-2021-0056476 | 5/2021 |
| WO | WO 2018/162874 A1 | 9/2018 |

OTHER PUBLICATIONS

Yin, Shihul, et al. "High-throughput in-memory computing for binary deep neural networks with monolithically integrated RRAM and 90-nm CMOS." *IEEE Transactions on Electron Devices*, vol. 67, Issue: 10, Oct. 2020, pp. 4185-4192.

Chen, Wei-Hao, et al. "A 65nm 1Mb nonvolatile computing-in-memory ReRAM macro with sub-16ns multiply-and-accumulate for binary DNN AI edge processors." *2018 IEEE International Solid-State Circuits Conference—(ISSCC)*. IEEE, 2018, pp. 494-496.

Wei, Ligiong, et al. "13.3 A 7Mb STT-MRAM in 22FFL FinFET technology with 4ns read sensing time at 0.9 V using write-verify-write scheme and offset-cancellation sensing technique." *2019 IEEE International Solid-State Circuits Conference—(ISSCC)*. IEEE, 2019, pp. 214-216.

* cited by examiner

DEVICE WITH NEURAL NETWORK

CROSS-REFERENCE TO RELATED APPLICATIONS

This application claims the benefit under 35 USC § 119(a) of Korean Patent Application No. 10-2021-0179808, filed on Dec. 15, 2021 in the Korean Intellectual Property Office, the entire disclosure of which is incorporated herein by reference for all purposes.

BACKGROUND

1. Field

The following disclosure relates to a device with a neural network.

2. Description of Related Art

In a von Neumann computer architecture, frequent movement of huge data between a processor and a memory may cause long delays and large power consumption, limiting chip performance. For software-based deep neural network operations, artificial intelligence (AI) accelerator hardware such as a high-performance central processing unit (CPU), a graphics processing unit (GPU), or an application-specific integrated circuit (ASIC) may be used.

A neuromorphic architecture may perform operations directly at a location in a memory device storing data, and store and update a connection strength (e.g., a synaptic weight) between neuron circuits in the memory device. A neuromorphic operation method may be applied to AI, big data, sensor network, pattern/object recognition, and the like. The neuromorphic architecture may be implemented by hardware using analog memory.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a device with a neural network includes: a synaptic memory cell comprising a resistive memory element, which is disposed along an output line and which has either one of a first resistance value and a second resistance value, and configured to generate a column signal based on the resistive memory element and an input signal in response to the input signal being received through an input line; a reference memory cell comprising a reference memory element, which is disposed along a reference line and which has the second resistance value different from the first resistance value, and configured to generate a reference signal based on the reference memory element and the input signal; and an output circuit configured to generate an output signal for the output line from the column signal and the reference signal.

The synaptic memory cell may include resistive memory elements, including the resistive memory element, corresponding to a number of bits for representing a synaptic weight assigned to the synaptic memory cell, and the resistive memory elements corresponding to the number of bits may be arranged along a same input line.

The reference memory cell may include reference memory elements, including the reference memory element, corresponding to the number of bits for representing the synaptic weight, and the reference memory elements corresponding to the number of bits may be arranged along a same input line.

Resistive memory elements of synaptic memory cells connected to a same output line may be connected to each other in parallel.

The device may include another synaptic memory cell disposed along another output line, wherein the output circuit may be configured to individually generate output signals for each of the output line and the other output line, using a same reference memory cell.

The output circuit may include a readout circuit configured to generate a column integrated signal by integrating the column signal for each bit of the synaptic memory cell and generate a reference integrated signal by integrating the reference signal for each bit of the reference memory cell.

The readout circuit may include a current mirror configured to mirror the column signal to generate a current of a multiple corresponding to each bit of the synaptic memory cell and each bit of the reference memory cell.

The output circuit may be configured to generate the output signal corresponding to a difference between the column integrated signal and the reference integrated signal.

The output circuit may include a capacitor configured to allow a current corresponding to the reference integrated signal to flow into a node and to allow a current corresponding to the column integrated signal to flow out from the node, such that a current corresponding to the difference between the column integrated signal and the reference integrated signal flows.

The output circuit may be configured to generate, as the output signal, a current corresponding to an integer multiple of a net current that is a difference between a first current based on a resistive memory element with the first resistance value and a second current based on a resistive memory element with the second resistance value.

The output circuit further may include a leaky integrate-and-fire (LIF) circuit configured to perform firing to another neural network device based on a result obtained by comparing the output signal to a threshold.

The LIF circuit may be configured to leak the output signal in response to a voltage integrated based on the output signal not reaching a threshold voltage within a threshold time.

The LIF circuit may be configured to perform firing to the other neuron circuit in response to a voltage integrated based on the output signal reaching a threshold voltage within a threshold time corresponding to the threshold.

The device may include a threshold memory array comprising a plurality of memory elements, wherein one or more of the plurality of memory elements is designated based on the threshold and has the first resistance value.

The device may include an additional reference memory cell configured to share a reference word line with the threshold memory array, and comprising an additional reference memory element, which is disposed along the reference word line and which has the second resistance value.

The output circuit may be configured to set a threshold time corresponding to the threshold based on a signal generated based on a threshold memory cell of the threshold memory array and a signal generated based on the additional reference memory cell.

The output circuit may be configured to initiate an integration of a current corresponding to a difference between the signal generated based on the threshold memory cell and the signal generated based on the additional reference memory cell, and to output a signal indicating a threshold time corresponding to the threshold in response to a voltage corresponding to the integrated current exceeding a threshold voltage.

The output circuit may be configured to apply a threshold time, corresponding to the threshold, determined based on the threshold memory cell and the additional reference memory cell to the output signal for the output line and another output signal for another output line.

The output circuit may be configured to obtain a value of a multiply-and-accumulate (MAC) between a synaptic weight and an input signal received along the input line, based on a result obtained by interpreting the output signal, and to transmit a node value determined based on the obtained value of the MAC to another neuron circuit.

In another general aspect, an electronic device includes a plurality of neural network circuits, wherein the device is one of the neural network circuits.

In another general aspect, a method with a neural network includes: generating a column signal based on an input signal and a resistive memory element of a synaptic memory cell to which the input signal is applied through an input line among one or more memory cells arranged along an output line; generating a reference signal based on the input signal and a reference memory element having a reference resistance value of a reference memory cell to which the input signal is applied among one or more memory cells arranged along a reference line; and generating an output signal for the output line from the column signal and the reference signal.

In another general aspect, a device with a neural network includes: a synaptic memory cell comprising a plurality of resistive memory elements, each having either one of a first resistance value and a second resistance value, and configured to generate a column signal based on an input signal being received through an input line; a reference memory cell comprising a plurality of reference memory elements, each having the second resistance value, and configured to generate a reference signal based on the input signal; and an output circuit configured to: generate a column integrated signal by integrating the column signal for each bit of the synaptic memory cell and generate a reference integrated signal by integrating the reference signal for each bit of the reference memory cell; and generate an output signal corresponding to a difference between the column integrated signal and the reference integrated signal.

The output circuit may be configured to generate the output signal corresponding to a product between: a summation of a number of the resistive memory elements having the first resistance value; and a difference between a value of a current flowing in resistive memory elements having the first resistance value and a value of a current flowing in resistive memory elements having the second resistance value.

The second resistance value may be greater than the first resistance value, and the resistive memory elements may include a magnetic random-access memory (MRAM).

Other features and aspects will be apparent from the following detailed description, the drawings, and the claims.

Figure 1:
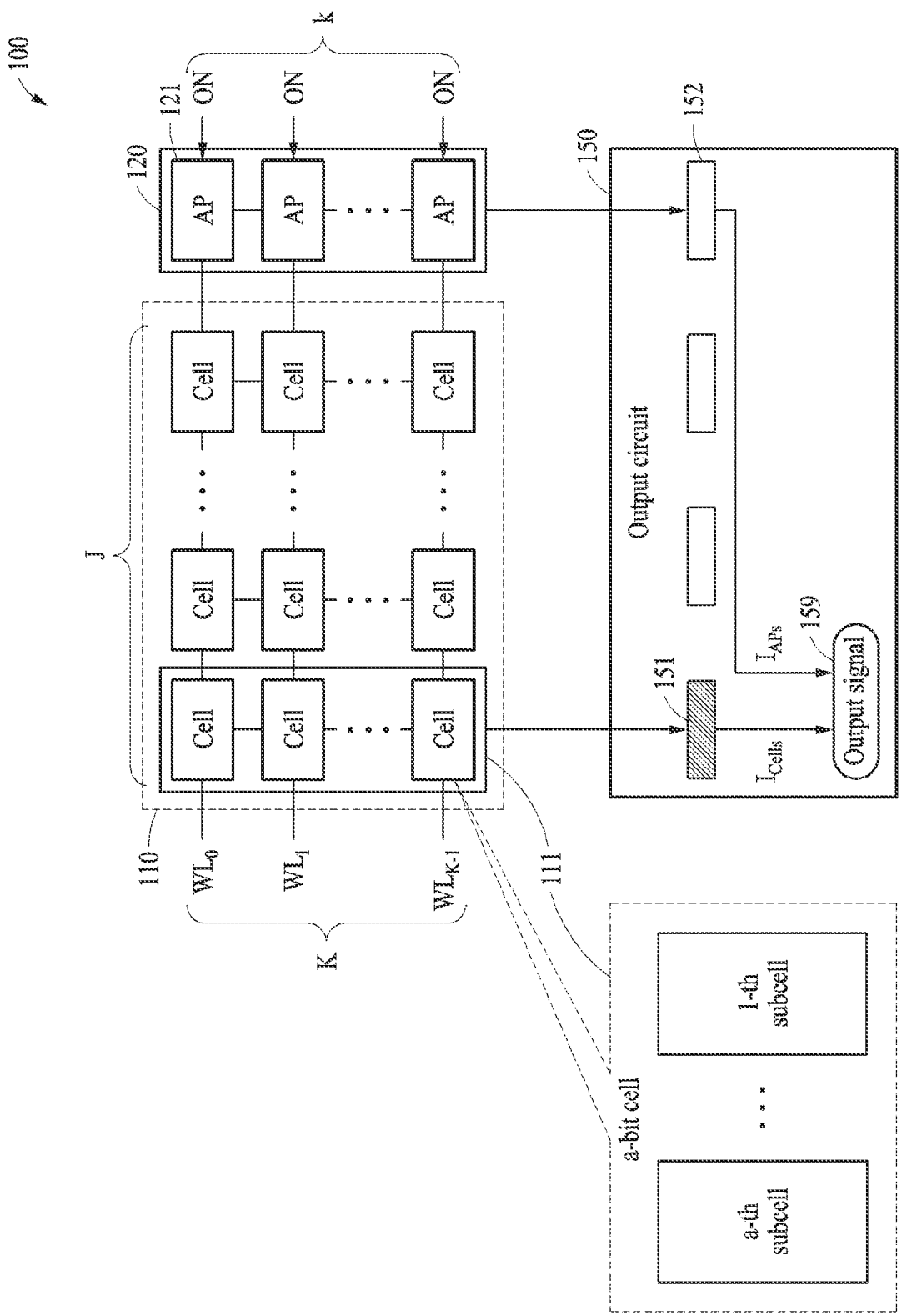
FIG. 1 illustrates an example of a neural network circuit.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known, after an understanding of the disclosure of this application, may be omitted for increased clarity and conciseness.

Although terms such as "first," "second," and "third" are used to explain various members, components, regions, layers, or sections, these members, components, regions, layers, or sections are not to be limited by these terms. Rather, these terms should be used only to distinguish one member, component, region, layer, or section from another member, component, region, layer, or section. For example, a "first" member, component, region, layer, or section referred to in the examples described herein may also be referred to as a "second" member, component, region, layer, or section without departing from the teachings of the examples.

Throughout the specification, when a component is described as being "connected to," or "coupled to" another component, it may be directly "connected to," or "coupled to" the other component, or there may be one or more other components intervening therebetween. In contrast, when an element is described as being "directly connected to," or "directly coupled to" another element, there can be no other elements intervening therebetween. Likewise, similar expressions, for example, "between" and "immediately between," and "adjacent to" and "immediately adjacent to," are also to be construed in the same way. As used herein, the term "and/or" includes any one and any combination of any two or more of the associated listed items.

The terminology used herein is for describing various examples only and is not to be used to limit the disclosure. The articles "a", "an", and "the" are intended to include the plural forms as well, unless the context clearly indicates otherwise. It will be further understood that the terms "comprises/including" and/or "includes/including" when used herein, specify the presence of stated features, integers, steps, operations, elements, components, and/or a combination thereof, but do not preclude the presence or addition of one or more other features, integers, steps, operations, elements, components, and/or combinations thereof. The use of the term "may" herein with respect to an example or embodiment (for example, as to what an example or embodiment may include or implement) means that at least one example or embodiment exists where such a feature is included or implemented, while all examples are not limited thereto.

Unless otherwise defined, all terms, including technical and scientific terms, used herein have the same meaning as commonly understood by one of ordinary skill in the art to which this disclosure pertains and after an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

Hereinafter, examples will be described in detail with reference to the accompanying drawings. When describing the example embodiments with reference to the accompanying drawings, like reference numerals refer to like elements and a repeated description related thereto will be omitted.

FIG. 1 illustrates an example of a neural network circuit.

A neural network circuit 100 (e.g., a neural network device) may be or include a circuit for simulating synapses (e.g., connections) that connect neuron circuits of a previous layer and neuron circuits of a target layer in a neural network. An electronic device including the neural network circuit 100 may also be referred to as a "neural network device." A neuron circuit may include a circuit in which activation of neurons (e.g., nodes) and/or an activation function of a neural network is implemented. The neural network may include a plurality of layers each having a plurality of nodes, and the previous layer may be a layer connected prior to the target layer in the neural network. A node of the neural network may correspond to a neuron circuit of the neural network circuit 100. The neural network circuit 100 may transmit a node value (e.g., an input value) output from the neuron circuit of the previous layer to the neuron circuit of the target layer based on a connection strength (e.g., a synaptic weight) between the neuron circuits. A target neuron circuit of the target layer may have, as a node value, a result of applying an activation function to a weighted sum based on synaptic weight values and node values received from previous neuron circuits of the previous layer connected to the target neuron circuit. In the present specification, a neuron circuit of the neural network circuit 100 may be or include an output circuit 150, and the neuron circuit of the neural network circuit 100 may implement a spiking neural network and may include a leaky Integrate-end-fire (LIF) circuit. However, the examples are not limited thereto, and an activation function of the neural network may also be implemented as a circuit designed in a different manner. While certain circuits may be referred to "neuron circuits", nodes may be referred to as "neurons," and connections may be referred to "synapses", such reference is not intended to impart any relatedness with respect to how the neural network architecture computationally maps or thereby intuitively recognizes information and how a human's neurons operate. I.e., the terms "neuron circuits", "neurons", and "synapses" are merely terms of art referring to the hardware implemented nodes of a neural network.

The neural network circuit 100 may include a synaptic memory array 110, a reference memory array 120, and the output circuit 150. The synaptic memory array 110 and the reference memory array 120 may also be collectively referred to as a "memory array".

The synaptic memory array 110 may include a plurality of synaptic memory cells 111 arranged along an input line and an output line. The plurality of synaptic memory cells 111 may be arranged in a form of a crossbar array. The input line may be a line for receiving an input, and is shown as "K" word lines $WL_0$ to $WL_{K-1}$ in FIG. 1. K may be an integer greater than or equal to "1". The output line may output an output signal 159 that represents a value (e.g., a result value of a multiply-and-accumulate (MAC), or a weighted sum) obtained by summing results of operations (e.g., multiplication) between input values indicated by respective input signals and synaptic weights indicated by resistive memory elements of the synaptic memory cells 111 arranged along the output line. The output line is illustrated as "J" lines in FIG. 1, and J may be an integer greater than or equal to "1". Accordingly, the synaptic memory array 110 may include "K×J" synaptic memory cells 111. For example, the neural network circuit 100 of FIG. 1 may also be interpreted as a circuit in which a synaptic connection connecting "K" previous nodes and "J" next nodes is implemented. When a synaptic weight is represented by "a" bits, each output line may include "a" bit lines. In this example, "a" may be an integer greater than or equal to "1". The output signal 159 output from one output line may be a difference signal between a signal obtained by integrating column signals (e.g., bit column signals) generated in bit lines included in the output line and a signal obtained by integrating reference signals generated in a reference line.

The input line may receive an input signal through a pre-synaptic circuit. The pre-synaptic circuit may receive an output of a previous node (e.g., a previous neuron circuit) of the neural network and transmit the output to a synaptic memory element of a current node. The pre-synaptic circuit may also be referred to as an "axon circuit." The output line may be connected to a post-synaptic circuit, and may transmit a signal corresponding to a value of a MAC between input signals and synaptic weights of synaptic memory elements connected to the output line to the post-synaptic circuit. The post-synaptic circuit may fire or transmit the output signal 159 corresponding to the value of the MAC between the input signals and the synaptic weights to a next node (e.g., a next synaptic circuit). The post-synaptic circuit may also be referred to as a "dendrite circuit", and may be implemented as, for example, a LIF circuit (a non-limiting example of which will be described below).

The input signal may be a signal received through an input line. In an example, when the neural network circuit 100 receives an input signal corresponding to a bit value of "1" from one input line, an input voltage may be applied to the input line. In another example, when an input signal of one input line corresponds to a bit value of "0", the neural network circuit 100 may deactivate the input line, e.g., the neural network circuit 100 may not apply a voltage to the input line or may apply a voltage of 0 voltage (V). However, an input voltage applied for each bit value represented by an input signal is not limited to those described above. In an example of FIG. 1, an activation value (e.g., a voltage corresponding to a bit value of "1") may be applied to "k" input lines among the "K" input lines. In this example, "k" may be an integer greater than or equal to "0" or less than or equal to "K".

The synaptic memory cell 111 may include a resistive memory element that is disposed along the output line and that has either one of a first resistance value and a second resistance value. The synaptic memory cell 111 may include resistive memory elements corresponding to a number of bits for representing a synaptic weight assigned to the synaptic memory cell 111. For example, the synaptic memory cell 111 may include the same number of resistive memory elements as the number of bits. The resistive memory elements corresponding to the number of bits may be arranged along the same input line.

The synaptic memory cell 111 may generate a column signal based on the resistive memory element and the input signal, in response to receiving the input signal through the input line. Each of the first resistance value and the second resistance value may be mapped to a binarized value. For example, the first resistance value and the second resistance value may indicate a bit value of "0" or "1", respectively. In an example, the first resistance value, as a low resistance, may indicate a bit value of "0", and the second resistance value, as a high resistance, may indicate a bit value of "1". However, the examples are not limited thereto, and bit values mapped to the first resistance value and the second resistance value may vary according to a design.

When a synaptic weight is expressed as a bit sequence with multiple bits, the synaptic memory cell 111 may also include a plurality of subcells. For example, the synaptic weight may be expressed as a bit sequence with "a" bits. For the synaptic weight of the "a" bits, the synaptic memory cell 111 may include "a" subcells. A first subcell may have a resistance value of a bit value corresponding to a least significant bit (LSB) digit of a bit sequence indicating a synaptic weight, and an a-th subcell may have a resistance value of a bit value corresponding to a most significant bit (MSB) digit. Each of the "a" subcells may include a resistive memory element having a resistance value corresponding to a bit value of a corresponding bit digit in the synaptic weight. The resistive memory element included in each of the "a" subcells may be set to have a resistance value mapped to a bit value of a corresponding bit digit. The resistive memory element may be set to have either one of the first resistance value and the second resistance value. Hereinafter, a non-limiting example in which the synaptic memory cell 111 is implemented as a 3-bit cell will be described with reference to FIG. 2.

The column signal may be a signal obtained by integrating signals output from synaptic memory cells 111 arranged along one column line in the synaptic memory array 110. For example, the column signal may be a signal corresponding to a value of a MAC between input values of input signals and bit values corresponding to resistive memory elements of subcells connected to the same bit line in the synaptic memory array 110. For example, a column signal of one bit line may be a signal corresponding to a value of a MAC of bit digits represented by the bit line in the output line. The neural network circuit 100 may obtain a signal corresponding to a sum of products between each of column signals of bit lines included in the same output line and a weight (hereinafter, referred to as a "bit weight") corresponding to a bit digit of a corresponding bit line, which will be described below. For example, a bit weight corresponding to an LSB may be "¼", a bit weight corresponding to a first bit digit from the LSB may be "½", and a bit weight of a second bit digit from the LSB may be "1". However, the aforementioned synaptic memory cells 111 may be designed assuming that the bit weight of the second bit digit from the LSB is 1, and the bit weight is not limited thereto and may vary depending on the design. For convenience of description, in the present specification, one column is mainly illustrated as a vertical line, but the examples are not limited thereto, and a shape of a column line may vary according to a design.

As described above, the resistive memory element may be an element that may have either one of the first resistance value and the second resistance value. For example, the resistive memory element may be a magnetic random-access memory (MRAM). An MRAM may have either one of two states of a magnetic tunnel junction (MTJ). An MRAM in a parallel (P) state may have the first resistance value, and an MRAM in an anti-parallel (AP) state may have the second resistance value. The second resistance value may be greater than the first resistance value. The first resistance value and the second resistance value may also be referred to as a "low resistance value" and a "high resistance value", respectively. The AP state and the P state may also be referred to as a "high resistance state" and a "low resistance state", respectively. A resistance ratio of the second resistance value to the first resistance value of the MRAM may be "2". However, the resistance ratio of the resistive memory element is not limited to "2", and the resistance ratio may vary depending on a type of resistive memory elements. The neural network circuit 100 may generate a net signal using the reference memory array 120, a non-limiting example of which will be described below, to identify signals output according to the first resistance value and the second resistance value of the resistive memory element.

Resistive memory elements in the P state and AP state are mainly described herein for convenience of description, but the examples are not limited thereto. The P state may be interpreted as a state of having the first resistance value and the AP state may be interpreted as a state of having the second resistance value, unless otherwise described.

The reference memory array 120 may include a plurality of reference memory cells 121 arranged along the reference line. In an example of FIG. 1, the reference memory cells 121 included in the reference memory array 120 may be arranged along the reference line. The reference memory array 120 may include the same number of reference memory cells 121 as a number of input lines.

A reference memory cell 121 may include a reference memory element that is disposed along the reference line and that has the second resistance value different from the first resistance value. The reference memory cell 121 may include reference memory elements corresponding to a number of bits for expressing the synaptic weight. For example, the reference memory cell 121 may include the same number of reference memory elements as the number of bits. The reference memory elements corresponding to the number of bits may be arranged along the same input line. Each of the reference memory cells 121 may include the same number of reference subcells as the number of bits, that is, the same number of resistive memory elements (e.g., reference memory elements) as the number of bits, similarly to the above-described synaptic memory cells 111. However, unlike the above-described synaptic memory cell 111, the reference memory cell 121 may include resistive memory elements that are all set to all have the second resistance value. The reference memory cell 121 may generate a reference signal based on the reference memory elements and the input signal. The reference signal may be a signal obtained by integrating signals output from the reference memory cells 121 arranged along the reference line in the reference memory array 120. The reference line may also include the same number of reference bit lines as the number of bits. For example, the reference signal may be a signal corresponding to a value of a MAC between input values of input signals and bit values corresponding to resistive memory elements of reference subcells connected to the same reference bit line in the reference memory array 120. For example, a reference signal of one reference bit line may be a signal corresponding to a value of a MAC of bit digits indicated by the reference bit line in the reference line. In non-limiting examples of the present specification, the resistive memory element set to the second resistance value is shown as an MRAM element AP in an AP state.

The output circuit 150 may generate the output signal 159 for the output line from the column signal and the reference signal. For reference, the neural network circuit 100 may further include another synaptic memory cell disposed along another output line. In this example, the output circuit 150 may individually generate output signals for each of the output line and the other output line, using the same reference memory cell. For example, the output circuit 150 may use the same reference column signal to generate different output signals for each output line. A non-limiting example operation of the output circuit 150 will be described below.

When an input is received to "K" word lines for accessing each synaptic memory element during a synapse operation, the neural network circuit 100 may integrate all signals (e.g., current signals) generated for each column. The output line may include bit lines corresponding to bit digits, and a column integrated signal $I_{Cells}$ output from the output line may be a signal obtained by integrating signals corresponding to bit weights applied to column signals of individual bit lines. The column integrated signal may be expressed as shown in Equation 1 below, for example.

$$I_{Cells} = MI_P + (N-M)I_{AP} \quad \text{Equation 1}$$

In Equation 1, $I_P$ denotes a current flowing in a resistive memory element in a P state (e.g., the first resistance value), and $I_{AP}$ denotes a current flowing in a resistive memory element in an AP state (e.g., the second resistance value). The column integrated signal $I_{Cells}$ may be a linear combination of $I_P$ and $I_{AP}$. A synaptic readout circuit 151 of the output circuit 150 may generate the column integrated signal $I_{Cells}$.

$$I_{Aps} = NI_{AP} \quad \text{Equation 2}$$

Equation 2 described above may represent a signal corresponding to a bit weight for each bit digit applied to a current signal flowing in a resistive memory element to which an input signal is applied among resistive memory elements in the AP state included in the reference memory array 120, for example. A reference integrated signal $I_{Aps}$ may be a signal integrated by applying a bit weight to a reference signal for each bit digit. A reference readout circuit 152 of the output circuitry 150 may generate the reference integrated signal $I_{Aps}$. In Equations 1 and 2 described above, coefficients N and M of the linear combination may be expressed as shown in Equations 3 and 4 below, for example.

$$N = k \cdot (2^a - 1) \quad \text{Equation 3}$$

$$M = \sum_{i=0}^{a-1} m_i \cdot 2^i, \text{ where } M \leq N, m_i = 0 \text{ or } 1 \quad \text{Equation 4}$$

In Equations 3 and 4, N denotes a value determined based on subcells connected to an activated word line (e.g., an input line), k denotes a number of activated word lines (e.g., input lines) as described above, and a may be a number of subcells included in each memory cell (e.g., a number of bits of a synaptic weight). For example, N may be a sum of values of power of 2 using a bit digit, represented by each subcell included in a synaptic memory cell 111 connected to the activated word line among synaptic memory cells 111 connected to one output line, as an exponent. M, which is an integer less than or equal to N, may be a value determined based on subcells in the P state (e.g., the first resistance value) among the synaptic memory cells 111 connected to the activated word line. For example, $m_i$ may be "1" when an i-th synaptic memory cell has the first resistance value, and may be "0" when the i-th synaptic memory cell has the second resistance value. For example, M may be a sum of values of power of 2 using a bit digit, represented by a subcell in the P state in a synaptic memory cell 111 connected to the activated word line among synaptic memory cells 111 connected to one output line, as an exponent.

$$I_{net, column} = I_{Cells} - I_{Aps} = M(I_P - I_{AP}) \quad \text{Equation 5}$$

The output circuit 150 of the neural network circuit 100 may generate an output signal 159 $I_{net,column}$ corresponding to a difference between the column integrated signal $I_{Cells}$ and the reference integrated signal $I_{Aps}$ based on Equation 5 described above, for example. According to Equation 5 described above, the output signal 159 $I_{net,column}$ may be a current signal proportional to M that is a sum of binary values indicated by resistive memory elements in the P state (e.g., the first resistance value). In the present specification, a difference signal between the column integrated signal $I_{Cells}$ and the reference integrated signal $I_{Aps}$ may also be referred to as a "valid signal" or a "net signal". When the output signal 159 $I_{net,column}$ is in a form of a current, the output signal 159 $I_{net,column}$ may also be referred to as a "net current". A net current generated using one resistive memory element may be either $(I_P - I_{AP})$ or $(I_{AP} - I_{AP}) = 0$. For example, the output signal 159 $I_{net,column}$ may be interpreted as, or may be equal to, a sum signal of "M" net currents. Accordingly, when performance of an integrator and a comparator is sufficient, the neural network circuit 100 may include a large number of synaptic memory cells 111.

In the present specification, a spiking neural network (SNN) that implements a function of a neural network that integrates currents according to a synaptic weight is mainly described as the neural network circuit 100, however, the examples are not limited thereto. The neural network circuit 100 may also be applied to a system that implements a MAC operation, such as a computation in memory (CIM) circuit and a vector matrix multiplication (VMM) circuit using a memory having a relatively low resistance ratio. Output values may be distinguished based on the above-described net signal, even when a resistance ratio between a low resistance and a high resistance of a resistive memory element included in the neural network circuit 100 is not high. In the neural network circuit 100, outputs may be distinguished based on the net signal, even when a resistive memory element in which a resistance ratio of a second resistance value to a first resistance value exceeds "1" is used. Accordingly, limitations in a design for sensing and summing current output from the memory array may be reduced.

Thus, the neural network circuit 100 may have a memory array having a further increased size by canceling a high resistance state. In addition, the neural network circuit 100 may be applicable to an artificial intelligence processor that processes a large quantity of data.

For reference, in the present specification, an example in which the output circuit 150 includes a LIF circuit as an activation function circuit is mainly described, however, the examples are not limited thereto. For example, the neural network circuit 100 may include an analog-to-digital converter, instead of a LIF circuit, and convert the above-described output signal from an analog signal to a digital value (e.g., output data). The electronic device including the neural network circuit 100 may also determine a value to be propagated to a next node by applying an activation function to output data. For example, the electronic device may also perform an operation corresponding to the activation function at a digital level.

Figure 2:
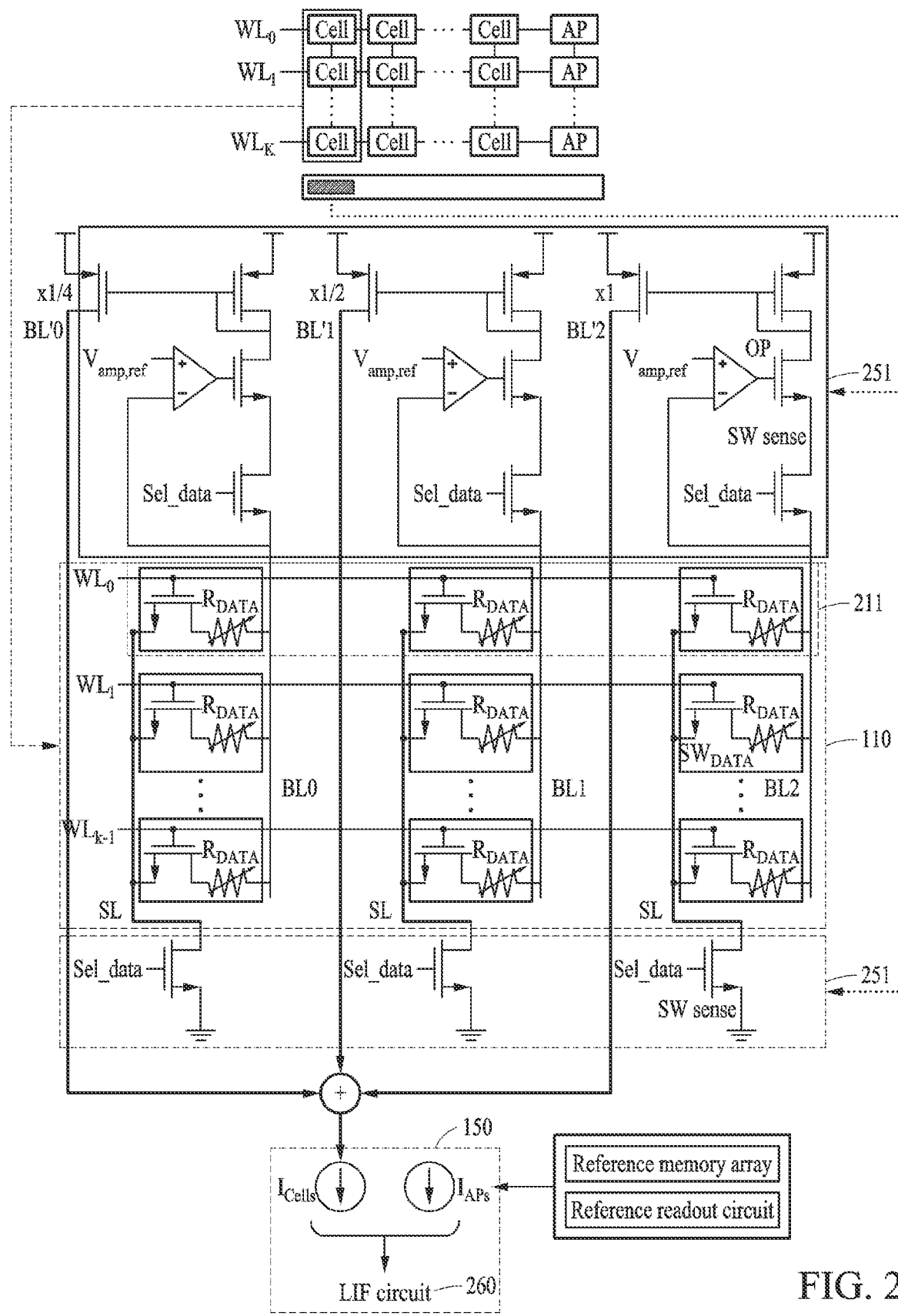
FIG. 2 illustrates an example of a synaptic memory cell and a readout circuit.

FIG. 2 illustrates an example of a synaptic memory cell and a readout circuit.

An output circuit 150 of a neural network circuit may include a LIF circuit and a readout circuit 251 (the synaptic readout circuit 151 of FIG. 1, as a non-limiting example) connected to a synaptic memory array 110. The output circuit 150 may also include a reference readout circuit connected to a reference memory array. In FIG. 2, a synaptic readout circuit is mainly described, and the reference readout circuit may also be configured in the same way as the synaptic readout circuit.

As shown in FIG. 2, resistive memory elements of synaptic memory cells 211 connected to the same output line may be connected to each other in parallel. For example, resistive memory elements connected to the same bit line in the synaptic memory cells 211 connected to the same output line may be connected to each other in parallel. Accordingly, current signals output from resistive memory elements of the same bit line may be integrated along an output line. In FIG. 2, a resistance of a resistive memory element is denoted by $R_{DATA}$. As described above, a resistive memory element to which an input signal is applied through word lines $WL_0$ to $WL_{K-1}$ among resistive memory elements arranged along bit lines BL0 to BL2 may generate a current signal according to a voltage applied to the resistive memory element. A switch $SW_{sense}$ (e.g., a transistor) to which the input signal is applied along the word lines $WL_0$ to $WL_{K-1}$ may connect a resistive memory element to a sense line. Here, a signal Sel_data may be applied, and accordingly the bit lines BL0 to BL2 and sense lines SL may be connected to a supply voltage and the ground, respectively.

An operational amplifier OP may have a high gain and may fix voltages of the bit lines BL0 to BL2 to $V_{amp\_ref}$, regardless of resistance values between the sense lines SL and the bit lines BL0 to BL2. For example, a constant voltage difference between the sense lines SL and the bit lines BL0 to BL2 may be maintained. Each of resistive memory elements may generate a current (e.g., a column signal) determined based on the resistance $R_{DATA}$ in the bit lines BL0 to BL2 with respect to the fixed voltage $V_{amp\_ref}$ applied equally to both ends.

The readout circuit 251 of the output circuit 150 may include a current mirror configured to mirror a column signal to generate a current of a multiple corresponding to each bit of a synaptic memory cell 211 and each bit of a reference memory cell. For example, the current mirror of the readout circuit 251 may mirror a column signal generated in a bit line to other bit lines BL'0 to BL'2. A magnitude of the mirrored current may vary depending on a width of a transistor. As described above, the current mirror may mirror the column signal at a current mirror ratio corresponding to a bit weight. For example, in FIG. 2, a current of the first bit line BL0 may be copied by a factor of ¼, a current of the second bit line BL1 may be copied by a factor of ½, and a current of the third bit line BL3 may be copied by a factor of 1. In a non-limiting example, the first bit line BL0 may correspond to a bit weight corresponding to an LSB, the second bit line BL1 may correspond to a bit weight corresponding to a first bit digit from the LSB, and the third bit line BL3 may correspond to a bit weight of a second bit digit from the LSB.

The readout circuit 251 of the output circuit 150 may generate a column integrated signal $I_{Cells}$ by integrating column signals for each bit of the synaptic memory cell 211, and may generate a reference integrated signal $I_{Aps}$ by integrating reference signals for each bit of a reference memory cell. For example, the output circuit 150 may generate the column integrated signal $I_{Cells}$ by summing currents mirrored from the column signal. Also, the output circuit 150 may generate the reference integrated signal $I_{Aps}$ through the same readout circuit 251 and operation as those described above for a reference signal. For reference, when a resistive memory element is implemented as an MRAM
, read disturbance may not occur only when a small amount of current flows through an MTJ. Accordingly, an amplifier capable of processing a relatively low common input may be used. The output circuit 150 may generate an output signal based on the column integrated signal $I_{Cells}$ and the reference integrated signal $I_{Aps}$, and may further include a LIF circuit 260 configured to process the generated output signal. A non-limiting example structure and an operation of the LIF circuit 260 will be described below.

The output circuit 150 may use an output signal that is a net signal between the column integrated signal $I_{Cells}$ and the reference integrated signal $I_{Aps}$ from the above-described readout circuit 251, and thus the neural network circuit of one or more embodiments may accurately identify signals even when one resistive memory element is in a P state and a plurality of resistive memory elements are in an AP state. This is because a net current may be determined only by the P state, regardless of a number of AP states. An example of the output signal (e.g., a net signal) obtained by reading out resistance values of resistive memory elements included in the synaptic memory array by the readout circuit 251 of the output circuit 150 has been described above with reference to FIG. 2, and an example of firing processing using the output signal will be described below with reference to FIG. 3.

Figure 3:
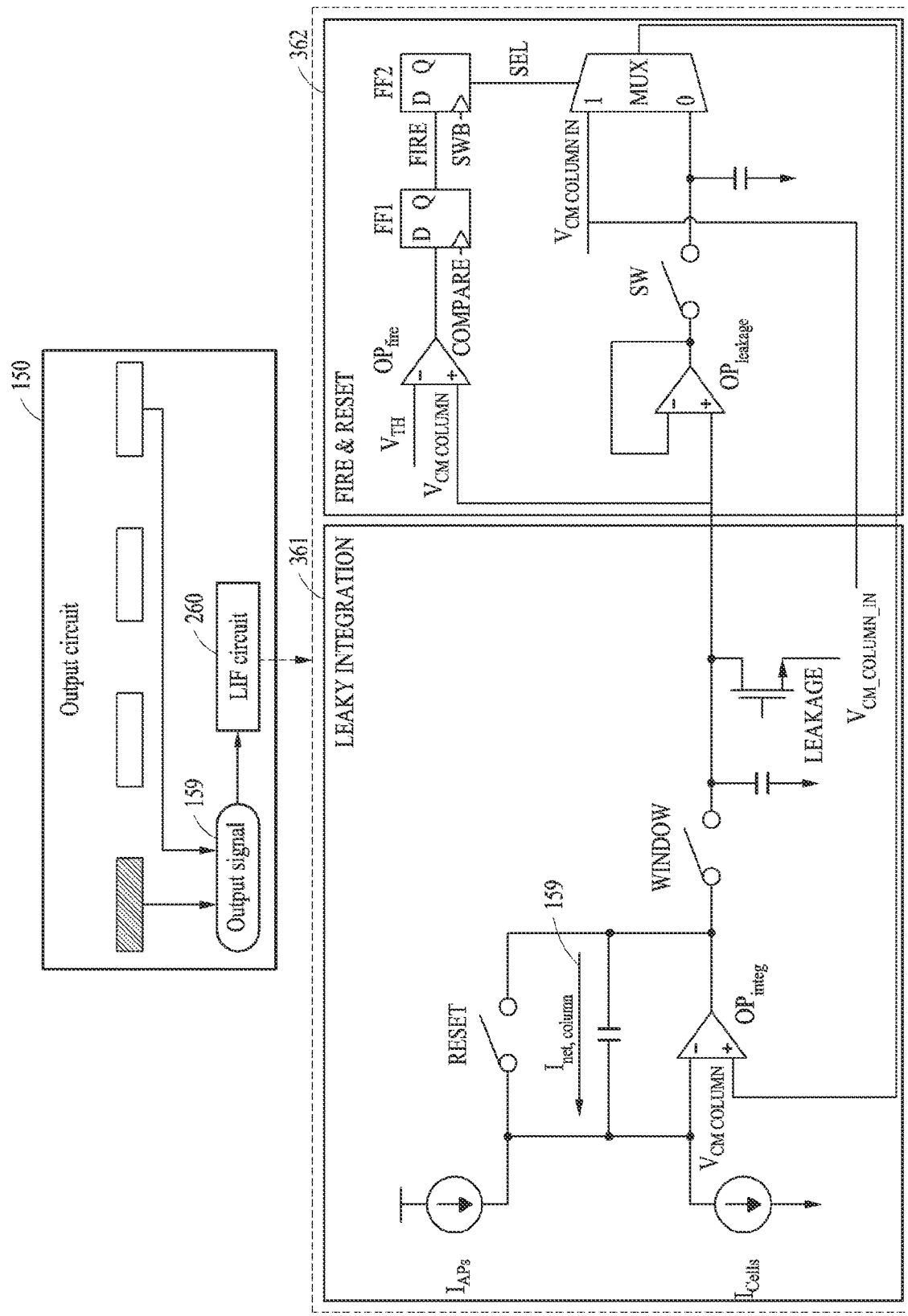
FIG. 3 illustrates an example of a leaky integrate-and-fire (LIF) circuit of an output circuit.

FIG. 3 illustrates an example of a leaky integrate-and-fire (LIF) circuit of an output circuit.

An output circuit 150 may include a LIF circuit 260. The LIF circuit 260, which is a circuit for simulating an operation of a neuron (e.g., a node of a neural network), may perform firing to other neuron circuits based on a result of a comparison between an output signal 159 and a threshold. The output signal 159 may be denoted by $I_{net,column}$ in Equation 5 described above, and accordingly further description thereof is not repeated herein. The LIF circuit 260 may include a leakage sub-circuit 361 and a firing sub-circuit 362. In neurons, when a stimulus exceeding a threshold is transmitted from a pre-neuron to a post-neuron, or when a plurality of stimuli less than or equal to the threshold are transmitted several times within a relatively short period of time (e.g., such that a sum of the plurality of stimuli received by the post-neuron within the period of time exceeds the threshold), an action potential may be generated. Subsequently, a membrane potential of a neuron may be reset to a basic voltage. However, when a stimulus less than or equal to the threshold is transmitted from a pre-neuron to a post-neuron, a postsynaptic potential (PSP), instead of the action potential, may be generated and leakage may occur little by little until a next stimulus arrives in the PSP. The LIF circuit 260 may be a circuit that implements the above-described firing or leakage of neurons.

The leakage sub-circuit 361 may receive the column integrated signal (e.g., $I_{Cells}$) and the reference integrated signal (e.g., $I_{Aps}$) described above with reference to FIG. 2. The column integrated signal and the reference integrated signal are modeled as a current source and illustrated as shown in FIG. 3 for convenience of description, and may actually be interpreted as a current supplied by the readout circuit illustrated in FIG. 2. The leakage sub-circuit 361 may include a capacitor configured to generate a net signal (e.g., a net current). For example, the output signal 159 may allow a current corresponding to the reference integrated signal $I_{Aps}$ to flow into a node of the capacitor, and allow a current corresponding to the column integrated signal $I_{Cells}$ to flow out from the node of the capacitor. By the above-described inflow of the reference integrated signal $I_{Aps}$ and outflow of the column integrated signal $I_{Cells}$, a current corresponding to a difference between the column integrated signal and the reference integrated signal may flow in the capacitor. For example, the output signal 159, which is a net current (e.g., $I_{net,column}$), may flow in the capacitor. The output circuit 150 may generate, as the output signal 159, a current (e.g., a net current $I_P$-$I_{AP}$) corresponding to an integer multiple of a net current that is a difference between a first current $I_P$ based on a resistive memory element having a first resistance value and a second current $I_{AP}$ based on a resistive memory element having a second resistance value. The leakage sub-circuit 361 may be deactivated while a reset signal RESET is applied, and may be activated while the reset signal RESET is not applied. For example, the leakage sub-circuit 361 may allow an output current according to the output signal 159 to leak for a threshold time after the reset signal RESET is not applied.

The output current of the output signal 159 may be converted to an output voltage while flowing in the capacitor. A leakage operational amplifier $OP_{integ}$ of the leakage sub-circuit 361 may be connected to a window switch at an output terminal, and the window switch may be connected to a capacitor connected to the ground. When a window signal WINDOW is being applied to the window switch, the window switch may be closed and the leakage operational amplifier $OP_{integ}$ and a capacitor connected to the ground may be connected. Thus, the output current of the output signal 159 may flow into the capacitor connected to the ground located at the output terminal of the leakage operational amplifier $OP_{integ}$. The capacitor connected to the ground may convert the output current to an output voltage by leaking charges corresponding to the output current. Here, a voltage charged in the capacitor connected to the ground may be leaked by a leakage transistor LEAKAGE. A bias voltage based on $V_{CM\_COLOUMN\_IN}$ may be applied to the leakage transistor LEAKAGE. The window switch may be turned on for a predetermined threshold time (e.g., a leakage time) by the window signal WINDOW. For example, the capacitor connected to the ground may leak an output current until a threshold time elapses after resetting.

According to an example, the leakage sub-circuit 361 may transmit the leaked output voltage to the firing sub-circuit 362 for the above-described threshold time. A comparator $OP_{fire}$ of the firing sub-circuit 362 may compare a preset threshold voltage $V_{TH}$ and an output voltage $V_{COLUMN}$. For example, the comparator $OP_{fire}$ may output a firing signal (e.g., "1") when the output voltage $V_{COLUMN}$ integrated for the threshold time exceeds the threshold voltage $V_{TH}$, and may output a leakage signal (e.g., "0") when the output voltage $V_{COLUMN}$ is less than or equal to the threshold voltage $V_{TH}$. For reference, the threshold time may be set as a time used until the threshold voltage $V_{TH}$ is achieved through leakage of a threshold current corresponding to the threshold in a separate circuit (e.g., a threshold time generation circuit), a non-limiting example of which will be described below. Since the output current and the threshold current are both currents, it may be difficult to compare current versus current. Accordingly, the comparator $OP_{fire}$ of the firing sub-circuit 362 may compare a voltage, which is converted from a current leaked for a threshold time from a point in time at which the signal RESET becomes "0" due to a generated window signal WINDOW of FIG. 7 (a non-limiting example of which will be described below) to a point in time at which the window signal WINDOW becomes "0", to the threshold voltage. In an example of a small amount of current, an amount of current converted into a voltage may be small, and accordingly the voltage may be less than the threshold voltage. In an example of a large amount of current, the amount of current converted into a voltage may be large, and accordingly the voltage may increase to the threshold voltage or greater and the comparator $OP_{fire}$ may output a fire pulse.

According to an example, the LIF circuit 260 may leak the output signal 159 in response to a voltage integrated based on the output signal 159 not reaching the threshold voltage within a threshold time. For example, when a leaked and converted output voltage is less than the threshold voltage, the firing sub-circuit 362 of the LIF circuit 260 may transmit the converted output voltage to the leakage operational amplifier $OP_{integ}$. An analog multiplexer (MUX) may provide the converted output voltage as a new common mode input $V_{CM\_COLUMN}$ of the leakage operational amplifier $OP_{integ}$. When an output signal 159 based on a next neuron input is generated, a leakage circuit may acquire a leaky integrated output voltage by continuing leakage of the output current based on the above-described common mode input.

According to an example, the LIF circuit 260 may perform firing to another neuron circuit in response to the voltage integrated based on the output signal 159 reaching the threshold voltage within a threshold time corresponding to the threshold. For example, when a leaked output voltage exceeds the threshold voltage, or when leaked voltages of a plurality of small output signals 159 exceed the threshold voltage, the comparator $OP_{fire}$ of the firing sub-circuit 362 may generate a firing signal. The firing signal may be a pulse output indicating firing. The firing signal may be generated as a signal synchronous with a clock signal through an analog amplifier-based comparator $OP_{fire}$ and a flip-flop circuit synchronous with the clock signal.

The firing sub-circuit 362 may control a selection signal SEL of an analog MUX circuit and transfer $V_{CM\_COLUMN\_IN}$ input from the outside to the leakage operational amplifier $OP_{integ}$ to initialize a common mode voltage.

The output circuit 150 may perform a leakage operation, a comparison operation, and a leakage operation separately for each circuit. Accordingly, the neural network circuit of one or more embodiments may minimize an error due to a size of the capacitor or a limitation of the leakage current in the output circuit 150. Furthermore, the output circuit 150 may also simulate firing in a unit of ms (millisecond) that is a stimulation period of a real organism.

In FIG. 3, the signals RESET and SW may be generated by a timing generator that receives an external clock Clk as control signals. A threshold time generation circuit, a non-limiting example of which will be described below, may generate a window signal WINDOW indicating a threshold time that is a criterion for whether to perform firing. The window signal WINDOW may provide a threshold time (e.g., an integration time) robust against a variation in a capacitor, a set threshold voltage, and a resistive memory element.

Figure 4:
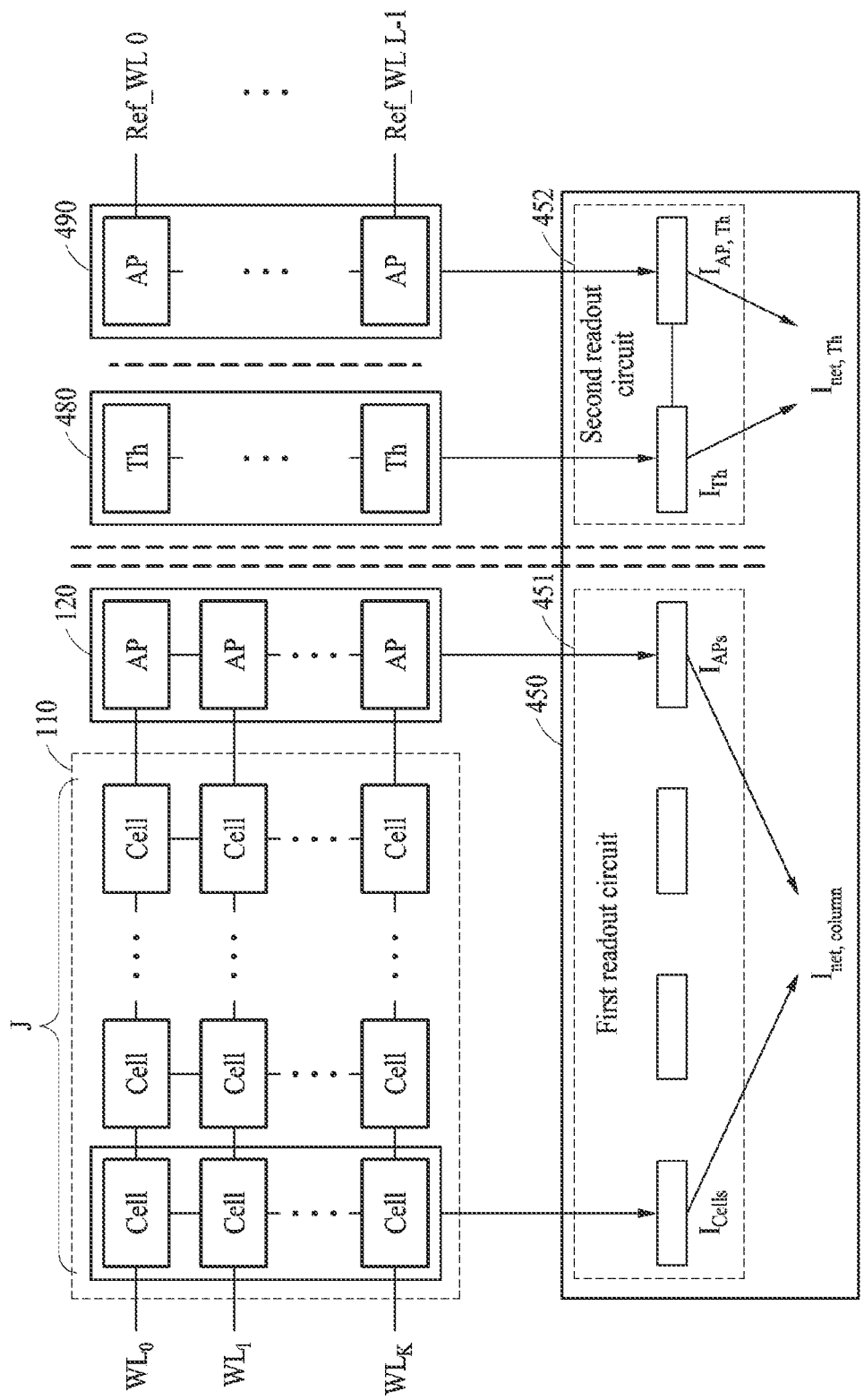
FIG. 4 illustrates an example of a threshold generation circuit and an additional reference circuit included in a neural network circuit.

FIG. 4 illustrates an example of a threshold generation circuit and an additional reference circuit included in a neural network circuit.

The neural network circuit may further include a circuit to set a threshold. For example, the neural network circuit may further include a threshold memory array 480 and additional reference memory cells. The synaptic memory array 110 and the reference memory array 120 have been described above with reference to FIG. 1, and accordingly further description thereof is not repeated herein.

The threshold memory array 480 may include a plurality of memory elements. One or more of the memory elements designated based on a set threshold may have a first resistance value (e.g., a P state). In FIG. 4, a memory cell included in the threshold memory array 480 may be a threshold memory cell and may be denoted by Th. For example, a memory element for representing a threshold may be selected based on a bit digit. For example, the threshold may be represented based on a number of memory elements having the first resistance value and a bit digit indicated by a corresponding memory element. The threshold memory array 480 may include threshold memory cells arranged along one column line. A column line may include a plurality of bit lines representing multiple bits. Each of the threshold memory cells may include subcells for each bit line. In an example, when the threshold is set as a threshold current of $6I_P$, a memory element corresponding to a first bit digit (e.g., $2^1=2$) from an LSB in the threshold memory array 480, and a memory element corresponding to a second bit digit (e.g., $2^2=4$) from the LSB may have the first resistance value, to express "$(2+4)*I_P$." Another non-limiting example of the threshold will be described with reference to FIGS. 5 and 6 below.

An additional reference memory cell may share reference word lines Ref_WL 0 through Ref_WL L-1 with the threshold generation circuit (e.g., the threshold memory array 480). The additional reference memory cell may have an additional reference memory element that is disposed along a reference word line and that has a second resistance value. Memory elements of all additional reference memory cells included in an additional reference memory array 490 may have a second resistance value. Additional reference memory cells will be described below, but may be used to express a threshold designated in the above-described threshold memory array 480 as a net signal.

For example, a signal (hereinafter, referred to as a "threshold integrated signal") integrated along a column of the above-described threshold memory array 480 may be expressed as shown in Equation 6 below, for example.

$$I_{Th}=T \cdot I_P+(R-T) \cdot I_{AP} \quad \text{Equation 6}$$

In Equation 6 described above, $I_P$ denotes a current flowing in a resistive memory element in a P state (e.g., a first resistance value), and $I_{AP}$ denotes a current flowing in a resistive memory element in an AP state (e.g., a second resistance value). A threshold integrated signal $I_{Th}$ may be a linear combination of $I_P$ and $I_{AP}$. A second readout circuit 452 of the output circuit 450 may generate the threshold integrated signal $I_{Th}$.

$$I_{AP,Th}=R \cdot I_{AP} \quad \text{Equation 7}$$

Equation 7 described above may represent a signal corresponding to a bit weight for each bit digit is applied to a current signal flowing in a resistive memory element to which a reference word signal is applied among resistive memory elements in the AP state included in the reference memory array 490, for example. An additional reference integrated signal $I_{AP,Th}$ may be an integrated signal by applying a bit weight to a reference signal for each bit digit. The second readout circuit 452 of the output circuit 450 may generate the additional reference integrated signal $I_{AP,Th}$. In Equations 6 and 7, coefficients T and R of the linear combination may be expressed as in Equations 8 and 9 below, for example.

$$R = L \cdot (2^a - 1) \quad \text{Equation 8}$$

$$T = \sum_{i=0}^{a-1} t_i \cdot 2^i, \text{ where } T \leq R, t_i = 0 \text{ or } 1 \quad \text{Equation 9}$$

In Equations 6 and 7, R denotes a value determined based on subcells connected to an activated reference word line (e.g., an input line), L denotes a number of activated reference word lines. FIG. 4 illustrates an example in which all reference word lines are activated, and "a" may indicate a number of subcells included in each memory cell or a number of bits of a synaptic weight. For example, R may be a sum of values of power of 2 using a bit digit, represented by each subcell included in a reference memory cell connected to an activated reference word line among threshold memory cells connected along one column, as an exponent. T may be an integer less than or equal to R, and may indicate a value determined based on subcells in a P state (e.g., a first resistance value) among threshold memory cells connected to an activated reference word line. T may correspond to a preset threshold. For example, $t_i$ may be "1" when an i-th threshold memory cell has the first resistance value, and may be "0" when the i-th threshold memory cell has the second resistance value. For example, T may be a sum of values of power of 2 using a bit digit, represented by a subcell in a P state in threshold memory cells connected in the same column, as an exponent.

$$I_{net,Th}=I_{Th}-I_{AP,Th}=T(I_P-I_{AP}) \quad \text{Equation 10}$$

The output circuit 450 of the neural network circuit may generate a threshold net signal $I_{net,Th}$ corresponding to a difference between the threshold integrated signal $I_{th}$ and the additional reference integrated signal $I_{AP,Th}$ according to Equation 10 described above, for example. The output circuit 450 may compare the threshold net signal $I_{net,Th}$ obtained based on Equation 10 described above to an output signal $I_{net,column}$ obtained from a first readout circuit 451 (e.g., a circuit including the synaptic readout circuit 151 and the reference readout circuit 152 of FIG. 1) based on Equation 5 described above. However, since it may be difficult to implement a circuit for comparing current vs current, as described above, the output circuit 450 may further include a threshold time generation circuit to indirectly compare the output signal $I_{net,column}$ and the threshold net signal $I_{net,Th}$. The threshold time generation circuit will be described with reference to FIG. 7 below.

The output circuit 450 may apply a threshold time corresponding to a threshold determined based on a threshold memory cell and an additional reference memory cell to an output signal for an output line and another output signal for another output line. For example, the output circuit 450 may apply a threshold time corresponding to a common threshold to output signals obtained from output lines of a synaptic memory array. An example of mapping a resistance value of a threshold memory cell to a set threshold will be described below with reference to FIGS. 5 and 6.

Figure 5:
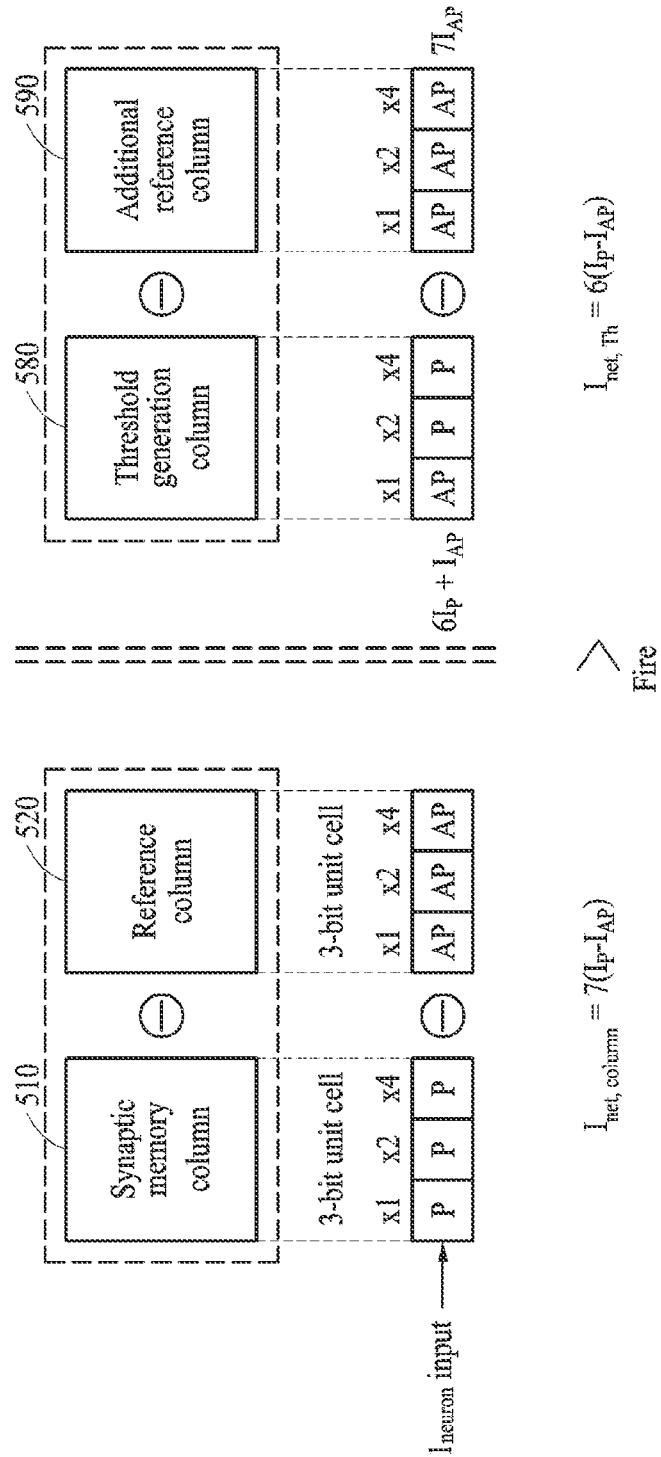
FIGS. 5 and 6 illustrate examples of firing comparison using net signals generated from a synaptic memory column, a reference column, a threshold generation column, and an additional reference column.
Figure 6:
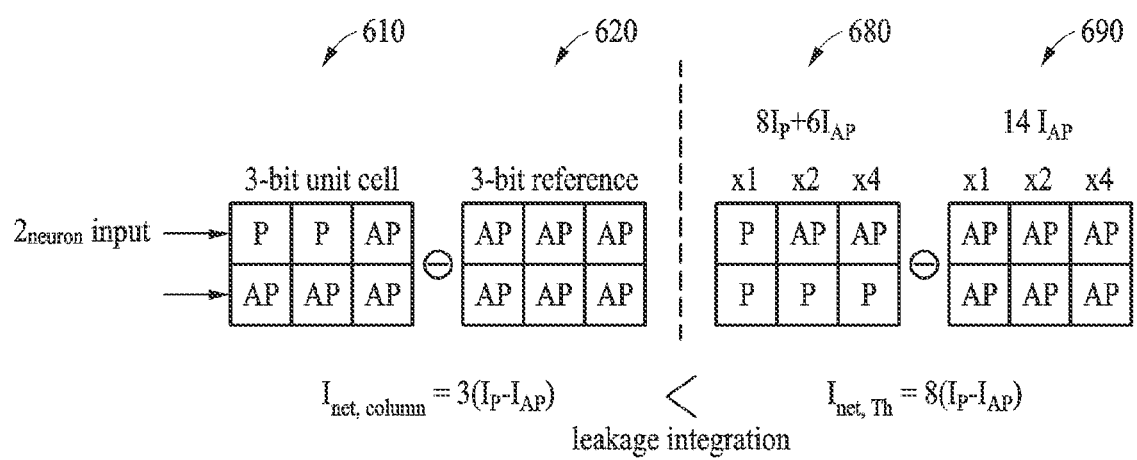

FIGS. 5 and 6 illustrate examples of a firing comparison using net signals generated from a synaptic memory column, a reference column, a threshold generation column, and an additional reference column.

In FIG. 5, one column of a synaptic memory array may be illustrated as a synaptic memory column 510, one column of a reference memory array may be illustrated as a reference column 520, one column of a threshold memory array may be illustrated as a threshold generation column 580, and one column of an additional reference memory array may be illustrated as an additional reference column 590. For convenience of description, each column may include 3-bit bit lines, and an input signal may be applied to one input line.

For example, all subcells of the synaptic memory column 510 may have a resistive memory element set to a first resistance value. As described above, all reference columns 520 may have memory elements set to a second resistance value. Each of the subcells may generate a current signal to which a bit weight (e.g., 1×) corresponding to an LSB, a bit weight (e.g., 2×) of a first bit digit from the LSB, and a bit weight (e.g., 4×) of a second bit digit from the LSB are applied. A column integrated signal $I_{Cells}$ of the synaptic memory column 510 may be $(1+2+4)*I_P$. A reference integrated signal $I_{Aps}$ of the reference column 520 may be $(1+2+4)*I_{Ap}$. For example, "N=M=7" may be satisfied in FIG. 5. An output signal $I_{net,column}$ may be $7(I_P-I_{AP})$. Similarly, a threshold integrated signal $I_{Th}$ in the threshold generation column 580 may be "$1*I_{AP}+(2+4)*I_P=6I_P+I_{AP}$." An additional reference integrated signal $I_{AP,Th}$ generated in the additional reference column 590 may be "$(1+2+4)*I_{AP}=7I_{AP}$." For example, "T=6" and "R=7" may be satisfied in FIG. 5. In FIG. 5, a threshold T may be set to "6", and a threshold net signal $I_{net,Th}$ may be determined to be $6(I_P-I_{AP})$. An output circuit may generate a firing signal because the output signal $I_{net,column}$ is greater than the threshold net signal $I_{net,Th}$.

In FIG. 6, the threshold T may be set to "8". To express "T=8", a threshold generation column 680 may include threshold memory cells arranged along two reference word lines. For reference, a number of input lines and a number of reference word lines may be independent of each other.

Similarly to the above description provided with reference to FIG. 5, a column integrated signal $I_{Cells}$ generated in a synaptic memory column 610 may be "$(1+2)*I_P+(4+1+2+4)*I_{AP}=3I_P+11I_{AP}$." A reference integrated signal $I_{Aps}$ generated in a reference column 620 may be "$(1+2+4+1+2+4)*I_{AP}=14I_{AP}$." For example, "N=14" and "M=3" may be satisfied in FIG. 6. An output signal $I_{net,column}$ may be $3(I_P-I_{AP})$. Similarly, a threshold integrated signal $I_{Th}$ in the threshold generation column 680 may be "$(1+1+2+4)*I_P+(2+4)*I_{AP}=8I_P+6I_{AP}$." The additional reference integrated signal $I_{AP,Th}$ generated in an additional reference column 690 may be "$(1+2+4+1+2+4)*I_{AP}=14I_{AP}$." For example, "T=8" and "R=14" may be satisfied in FIG. 6. In FIG. 6, the threshold T may be set to "8", and a threshold net signal $I_{net,Th}$ may be determined to be $8(I_P-I_{AP})$. An output circuit may perform a leakage operation because the output signal $I_{net,column}$ is less than the threshold net signal $I_{net,Th}$.

Figure 7:
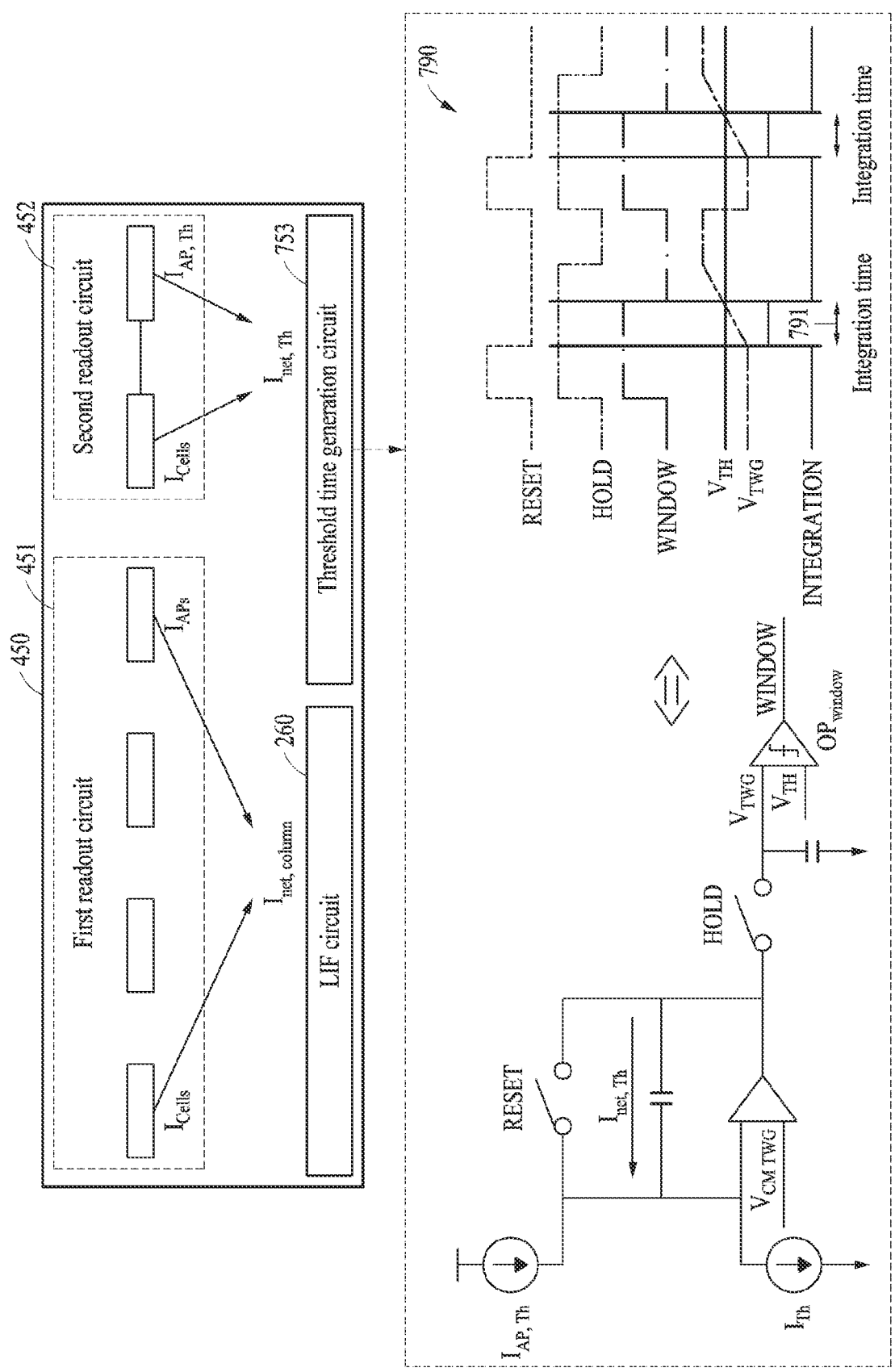
FIG. 7 illustrates an example of a threshold time generation circuit of an output circuit.

FIG. 7 illustrates an example of a threshold time generation circuit of an output circuit.

The output circuit may set a threshold time 791 corresponding to a threshold based on a signal generated based on a threshold memory cell and a signal generated based an additional reference memory cell. In FIG. 7, a threshold time generation circuit 753 for setting the threshold time 791 in the output circuit will be described. The first readout circuit 451, the second readout circuit 452, and the LIF circuit have been described above, and accordingly further description thereof is not repeated herein.

Since it is difficult to directly compare an output current to a current set to a threshold, as described above, the threshold time generation circuit 753 may set the threshold time 791 for current comparison. The threshold time generation circuit 753 may set a time used to reach a threshold voltage through a leakage of a current corresponding to the threshold as the threshold time 791. As described above, the output circuit may determine whether a time used to reach the same threshold voltage through a leakage of an output current is less than the threshold time 791. For example, the output circuit may indirectly compare a threshold current and an output current by determining whether an output voltage converted through a leakage of the output current exceeds a threshold voltage within the set threshold time 791.

The output circuit may initiate integration of a current corresponding to a difference between a signal generated based on a threshold memory cell and a signal generated based on an additional reference memory cell. When a voltage corresponding to the integrated current exceeds the threshold voltage, the output circuit may output a signal indicating the threshold time 791 corresponding to the threshold.

The threshold time generation circuit 753 may have a configuration partially similar to the leakage sub-circuit 361 described above with reference to FIG. 3. For example, the threshold time generation circuit 753 may allow a threshold integrated signal $I_{Th}$ to flow out from a node of a capacitor and may allow an additional reference integrated signal $I_{AP,Th}$ to flow into the node. Therefore, a threshold net signal $I_{net,Th}$ may flow in the capacitor. A capacitor and an operational amplifier may be designed to have the same type and size.

A reset signal RESET, a hold signal HOLD, and a window signal WINDOW shown in a timing diagram 790 may be generated by a timing generator. When the reset signal RESET=1, voltages at both ends of a capacitor in which the threshold net signal $I_{net,Th}$ flows may be $V_{CM,TWG}$, and accordingly initialization may be performed. When the reset signal RESET=0 and the hold signal HOLD=1, a voltage $V_{TWG}$ converted through an integration according to the threshold net signal $I_{net,Th}$ may be stored in the capacitor. The converted voltage $V_{TWG}$ may gradually increase in response to the integration of the threshold net signal $I_{net,Th}$. When the converted voltage $V_{TWG}$ exceeds a threshold voltage $V_{TH}$, a window comparator $OP_{window}$ may output "0". Accordingly, the threshold time 791 may be defined as a period of time from a point in time at which the reset signal RESET becomes "0" to a point in time at which the window signal WINDOW becomes "0". $V_{CM,TWG}$ may be set to be less than $V_{CM\_COLUMN\_IN}$.

Figure 8:
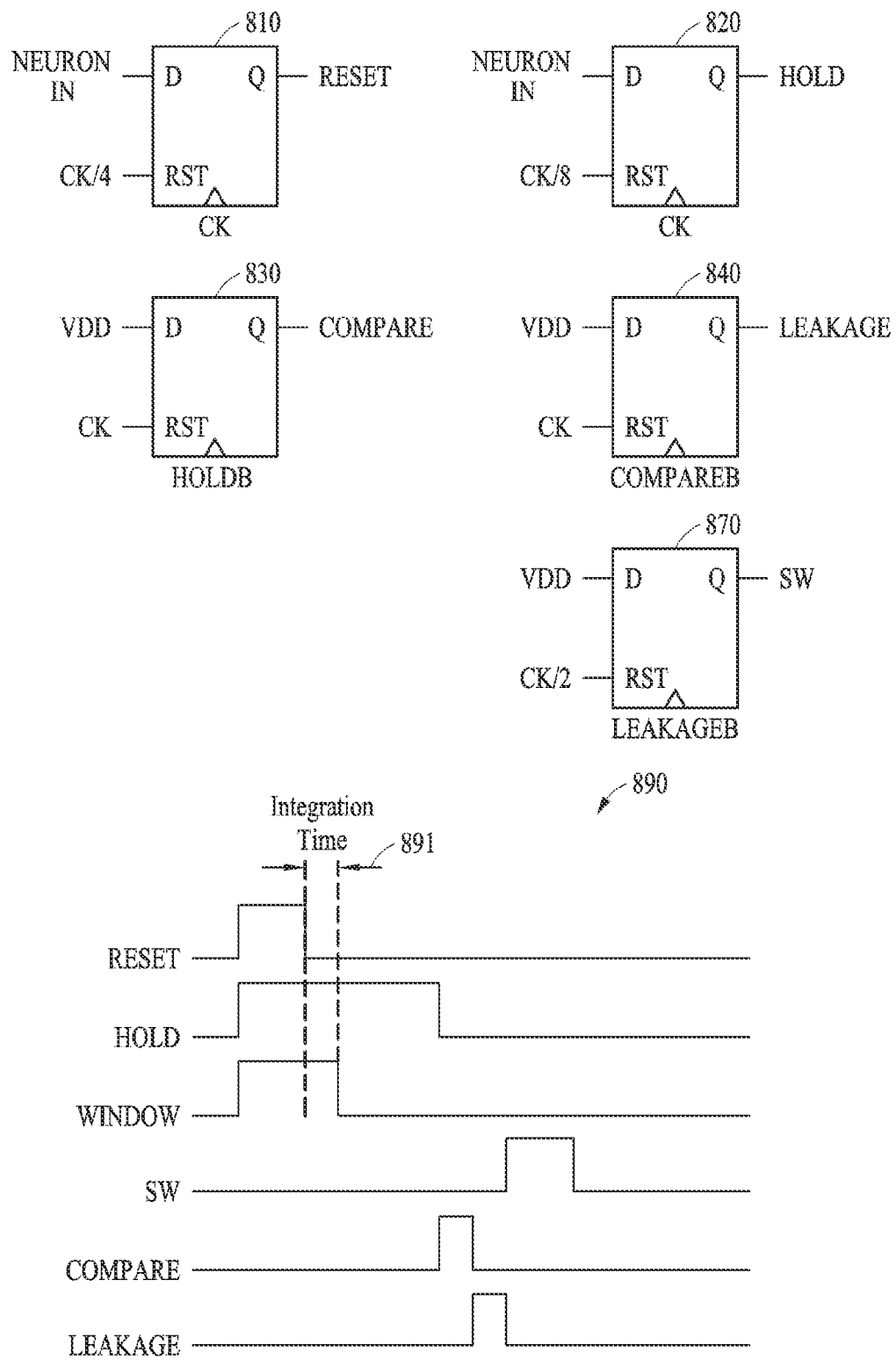
FIG. 8 illustrates an example of elements included in a LIF circuit in an output circuit and a timing diagram for each of a plurality of elements.

FIG. 8 illustrates an example of elements included in a LIF circuit in an output circuit and a timing diagram for each of a plurality of elements.

A reset flip-flop 810 may generate a reset signal RESET in response to a clock signal divided by ¼ and a neuron input (e.g., an input signal). A hold flip-flop 820 may generate a hold signal HOLD in response to a clock signal divided by ⅛ and a neuron input (e.g., an input signal). A comparison flip-flop 830 may generate a comparison signal COMPARE in response to a clock signal, a supply voltage VDD, and an inverted hold signal HOLDB. The comparison signal COMPARE may be a signal to initiate a comparison operation of a comparator when transmitting of an integrated output signal to an input of the comparator is completed. A leakage flip-flop 840 may generate a leakage signal LEAKAGE in response to a clock signal, a supply voltage VDD, and an inverted comparison signal COMPAREB. The leakage signal LEAKAGE may be a signal to perform a leakage operation of an output voltage after the above-described comparison operation. An SW flip-flop 870 may generate an SW signal to transfer a leaked voltage to a leakage sub-circuit to be added to an output based on a next input when the leaked voltage is present. As shown in a timing diagram 890 for the above-described signals, a threshold time 891 may be a time interval from a reset to a point in time at which a window signal WINDOW is deactivated.

Figure 9:
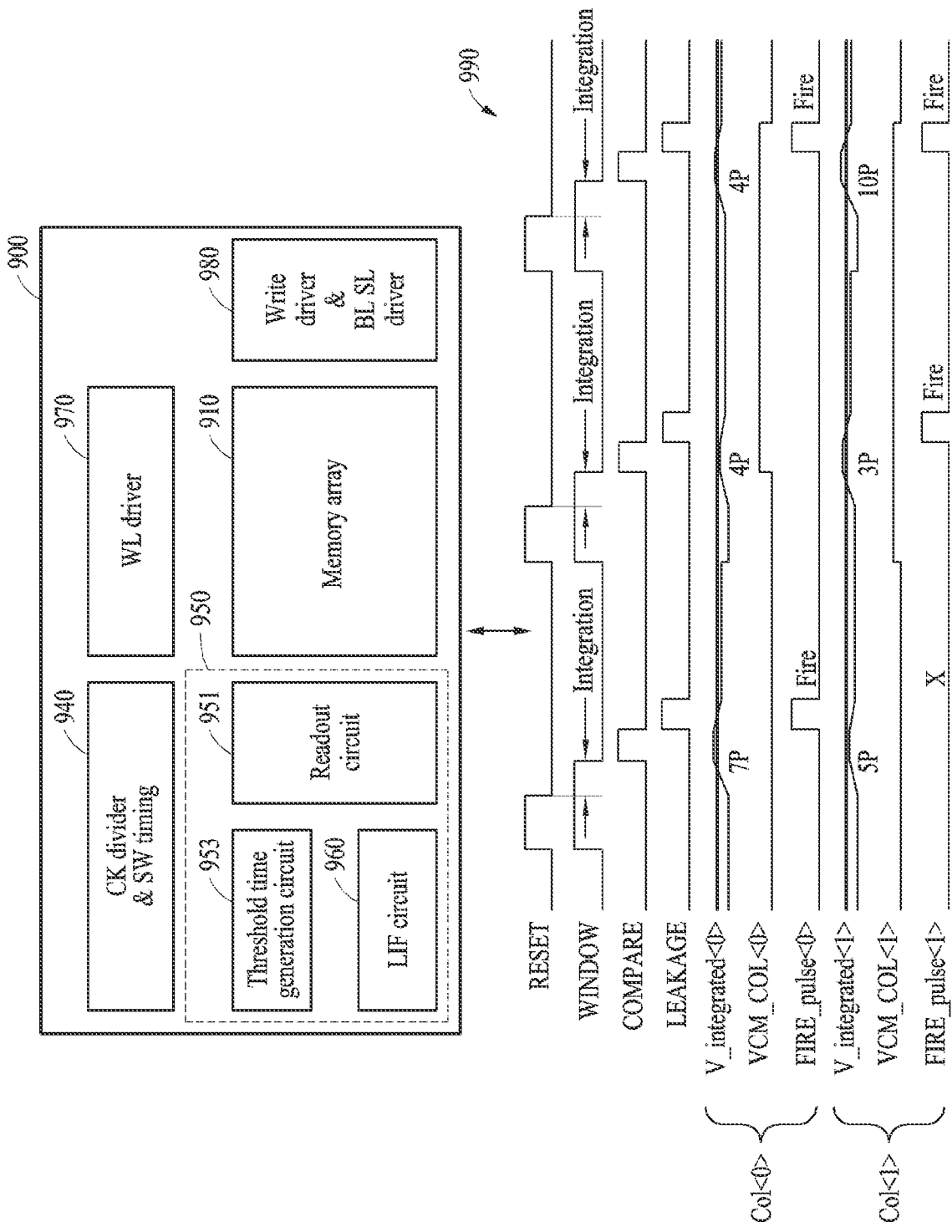
FIG. 9 illustrates an example of a firing operation of a neural network circuit.

FIG. 9 illustrates an example of a firing operation of a neural network circuit.

A neural network circuit 900 may include a memory array 910, an output circuit 950, a divider-and-timing generator 940, a word line driver 970, and a write driver 980. The memory array 910 may include a synaptic memory array, a reference memory array, a threshold memory array, and an additional reference memory array. The output circuit 950 may include a readout circuit 951, a threshold time generation circuit 953, and a LIF circuit 960. The memory array 910 and the output circuit 950 have been described above, and accordingly further description thereof is not repeated herein. The divider-and-timing generator 940 may generate signals (e.g., a clock signal and a control signal for an individual element) used in a circuit. The word line driver 970 may drive a word line (e.g., an input line) of the memory array 910. The write driver 980 may set a resistance value of a resistive memory element of a memory cell disposed along a bit line of the memory array 910, and may drive the bit line and a sense line.

A timing diagram 990 of FIG. 9 illustrates an example of an operation of the neural network circuit 900 with a threshold T set to "6". The threshold net signal $I_{net,Th}$ may be $6(I_P-I_{AP})$. A net current signal flowing in a column <0> may change to $7(I_P-I_{AP})$, $4(I_P-I_{AP})$, and $4(I_P-I_{AP})$ in sequence, and a net current signal flowing in a column <1> may change $5(I_P-I_{AP})$, $3(I_P-I_{AP})$, and $10(I_P-I_{AP})$ in sequence. As described above, when a stimulus equal to or less than a threshold is transmitted, a firing signal may not be output, and an integrated voltage V_integrated may be transferred to an interval in which a LEAKAGE pulse is high. A level of the integrated voltage may gradually decrease during the interval in which the LEAKAGE pulse is high. When a stimulus greater than or equal to the threshold is transmitted, a firing signal may be output, and the integrated voltage V_integrated may be initialized. In addition, when a stimulus less than or equal to the threshold is transmitted and leaked, when a stimulus is additionally transmitted, and when a sum of the two stimuli is equal to or greater than the threshold, a firing signal may be output. In the example shown in FIG. 9, since a threshold T is "7", firing, leakage and firing may be sequentially performed on the net current signal flowing in the column <0>. Leakage, leakage and firing may be sequentially performed on the net current signal flowing in the column <1>.

Figure 10:
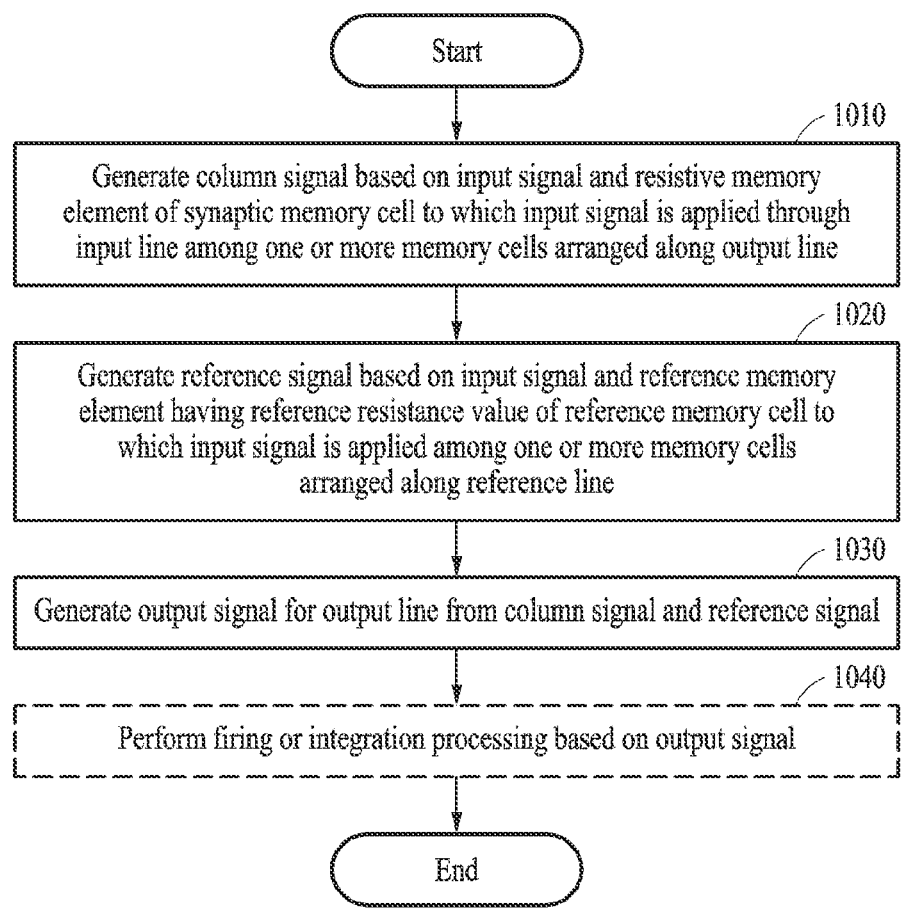
FIG. 10 illustrates an example of a method of operating a neural network circuit.

FIG. 10 illustrates an example of a method of operating a neural network circuit.

In operation 1010, the neural network circuit may generate a column signal based on an input signal and a resistive memory element of a synaptic memory cell to which the input signal is applied through an input line among one or more memory cells arranged along an output line. For example, when an input signal (e.g., a spike signal) is received through a pre-synaptic circuit, the neural network circuit may access a word line of a memory array. A readout circuitry of the neural network circuitry may generate a column signal (e.g., current) according to a synaptic weight and the input signal.

In operation 1020, the neural network circuit may generate a reference signal based on the input signal and a reference memory element having a reference resistance value of a reference memory cell to which the input signal is applied among one or more memory cells arranged along a reference line. The reference resistance value may be, for example, a second resistance value (e.g., a high resistance value corresponding to an AP state).

In operation 1030, the neural network circuit may generate an output signal for the output line from the column signal and the reference signal. The neural network circuit may generate, as an output signal, a net current corresponding to a difference between a column integrated signal and a reference integrated signal to cancel a current in a high resistance state.

In operation 1040, the neural network circuit may perform firing or integration processing based on the output signal. For example, the neural network circuit may leak the output signal for a threshold time. The neural network circuit may perform firing or integration according to a result of a comparison between the leaked output voltage with a threshold voltage. When the output voltage exceeds the threshold voltage, the neural network circuit may perform firing. When the output voltage is equal to or less than the threshold voltage, the neural network circuit may perform integration processing and maintain a corresponding voltage until a next neuron input is received.

However, processing of the output signal of a network is not limited to the above-described operation 1040. An output circuit of the neural network circuit may obtain a value of a MAC between a synaptic weight and an input signal received along the input line based on a result (e.g., an analog-to-digital converted value) obtained by interpreting the output signal, and may transmit a node value (e.g., an active value) determined based on the obtained value of the MAC to another neuron circuit.

The neural network circuits, synaptic memory arrays, reference memory arrays, output circuits, synaptic memory cells, reference memory cells, synaptic readout circuits, reference readout circuit, LIF circuits, leakage sub-circuits, firing sub-circuits, threshold memory arrays, first readout circuits, second readout circuits, synaptic memory columns, reference columns, threshold generation columns, additional reference columns, synaptic memory columns, threshold time generation circuits, reset flip-flops, hold flip-flops, comparison flip-flops, leakage flip-flops, SW flip-flops, memory arrays, divider-and-timing generators, word line drivers, write drivers, neural network circuit 100, synaptic memory array 110, reference memory array 120, output circuit 150, synaptic memory cells 111, reference memory cells 121, synaptic readout circuit 151, reference readout circuit 152, synaptic memory cells 211, readout circuit 251, LIF circuit 260, leakage sub-circuit 361, firing sub-circuit 362, threshold memory array 480, reference memory array 490, output circuit 450, first readout circuit 451, second readout circuit 452, synaptic memory column 510, reference column 520, threshold generation column 580, additional reference column 590, synaptic memory column 610, reference column 620, threshold generation column 680, additional reference column 690, threshold time generation circuit 753, reset flip-flop 810, hold flip-flop 820, comparison flip-flop 830, leakage flip-flop 840, SW flip-flop 870, neural network circuit 900, memory array 910, output circuit 950, divider-and-timing generator 940, word line driver 970, write driver 980, and other apparatuses, units, modules, devices, and components described herein with respect to FIGS. 1-10 are implemented by or representative of hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-10 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, bD-Res, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

What is claimed is:

1. A device with a neural network, comprising:
a plurality of synaptic memory cells, disposed along a first output line, configured to generate a column signal based on resistive memory elements and input signals being received through a plurality of input lines, each of the plurality of synaptic memory cells comprising a resistive memory element having either one of a first resistance value or a second resistance value;
a plurality of reference memory cells, disposed along a reference line with sharing the plurality of input lines with the plurality of synaptic memory cells respectively, configured to generate a reference signal based on reference memory elements and the input signals, each of the plurality of reference memory cells comprising a reference memory element having the second resistance value different from the first resistance value; and
an output circuit configured to generate an output signal, for the first output line, indicating a difference between the column signal and the reference signal,
wherein the output circuit is configured to generate, as the output signal, a current corresponding to an integer multiple of a net current that is a difference between a first current based on a resistive memory element with the first resistance value and a second current based on a resistive memory element with the second resistance value.

2. The device of claim 1, wherein a number of the plurality of reference memory cells along the reference line is equal to a number of the plurality of synaptic memory cells along the first output line.

3. The device of claim 1, wherein the second resistance value is greater than the first resistance value.

4. The device of claim 1, wherein
the synaptic memory cell comprises resistive memory elements, including the resistive memory element, corresponding to a number of bits for representing a synaptic weight assigned to the synaptic memory cell, and
the resistive memory elements corresponding to the number of bits are arranged along a same input line.

5. The device of claim 4, wherein
the reference memory cell comprises reference memory elements, including the reference memory element, corresponding to the number of bits for representing the synaptic weight, and
the reference memory elements corresponding to the number of bits are arranged along a same input line.

6. The device of claim 1, wherein the resistive memory elements of the synaptic memory cells connected to the first output line are connected to each other in parallel.

7. The device of claim 1, further comprising:
another synaptic memory cell disposed along a second output line,
wherein the output circuit is configured to respectively generate output signals for each of the first output line and the second output line, using a same reference memory cell.

8. The device of claim 1, wherein the output circuit comprises a readout circuit configured to generate a column integrated signal by integrating column bit signals for bits of the synaptic memory cell as the column signal, and generate a reference integrated signal by integrating reference bit signals for bits of the reference memory cell as the reference signal.

9. The device of claim 8, wherein the readout circuit comprises a current mirror configured to mirror a column bit signal to generate a current of a multiple corresponding to each bit of the synaptic memory cell and each bit of the reference memory cell.

10. The device of claim 8, wherein the output circuit is configured to generate the output signal indicating a difference between the column integrated signal and the reference integrated signal.

11. The device of claim 10, wherein the output circuit comprises a capacitor configured to allow a current corresponding to the reference integrated signal to flow into a node and to allow a current corresponding to the column integrated signal to flow out from the node, such that a current indicating the difference between the column integrated signal and the reference integrated signal flows.

12. The device of claim 1, wherein the output circuit comprises an analog-to-digital converter configured to convert the output signal from an analog signal to a digital value.

13. The device of claim 1, wherein the output circuit is configured to obtain a value of a multiply-and-accumulate (MAC) between a synaptic weight and an input signal received along the input line, based on a result obtained by interpreting the output signal, and to transmit a node value determined based on the obtained value of the MAC to another neuron circuit.

14. An electronic device comprising a plurality of neural network circuits, wherein the device of claim 1 is one of the neural network circuits.

15. A method with a neural network, the method comprising:
generating a column signal based on input signals and resistive memory elements of a plurality of synaptic memory cells, to which the input signals are applied through a plurality of input lines, arranged along a first output line;
generating a reference signal based on the input signals and reference memory elements having a reference resistance value of a plurality of reference memory cells, to which the input signals are applied, arranged along a reference line with sharing the plurality of input lines with the plurality of synaptic memory cells; and generating an output signal, for the first output line, indicating a difference between the column signal and the reference signal, wherein the generating comprises generating, as the output signal, a current corresponding to an integer multiple of a net current that is a difference between a first current based on a resistive memory element with the first resistance value and a second current based on a resistive memory element with the second resistance value.

16. A device with a neural network, comprising:

a plurality of synaptic memory cells comprising a plurality of resistive memory elements, each having either one of a first resistance value and a second resistance value, and configured to generate a column bit signal based on input signals being received through input lines;

a plurality of reference memory cells comprising a plurality of reference memory elements, each having the second resistance value, arranged along a reference line with sharing the input lines with the plurality of synaptic memory cells, and configured to generate reference bit signal based on the input signals; and an output circuit configured to:

generate a column integrated signal by integrating the column bit signal for each bit of the synaptic memory cell and generate a reference integrated signal by integrating the reference bit signal for each bit of the reference memory cell; and generate an output signal corresponding to a difference between the column integrated signal and the reference integrated signal, wherein the output circuit is configured to generate, as the output signal, a current corresponding to an integer multiple of a net current that is a difference between a first current based on a resistive memory element with the first resistance value and a second current based on a resistive memory element with the second resistance value.

17. The device of claim 16, wherein the output circuit is configured to generate the output signal corresponding to a product between:

a value determined based on a number of the resistive memory elements having the first resistance value; and a difference between a value of a current flowing in resistive memory elements having the first resistance value and a value of a current flowing in resistive memory elements having the second resistance value.

18. The device of claim 16, wherein the second resistance value is greater than the first resistance value, and the resistive memory elements comprise a magnetic random-access memory (MRAM).

19. The device of claim 16, wherein a number of the plurality of reference memory cells along a reference bit line is equal to a number of the plurality of synaptic memory cells along an output bit line.

* * * * *